United States Patent
Duensing et al.

(10) Patent No.: US 10,247,793 B2
(45) Date of Patent: Apr. 2, 2019

(54) RECEIVE COILS WITH LOW-LOSS DETUNE CIRCUITS FOR MAGNETIC RESONANCE (MR) SYSTEMS AND METHOD OF OPERATION THEREOF

(71) Applicant: KONINKLIJKE PHILIPS N.V., Eindhoven (NL)

(72) Inventors: George Randall Duensing, Eindhoven (NL); Arne Reykowski, Eindhoven (NL)

(*) Notice: Subject to any disclaimer, the term of this patent is extended or adjusted under 35 U.S.C. 154(b) by 118 days.

(21) Appl. No.: 15/129,429

(22) PCT Filed: Mar. 18, 2015

(86) PCT No.: PCT/IB2015/051970
§ 371 (c)(1),
(2) Date: Sep. 27, 2016

(87) PCT Pub. No.: WO2015/150952
PCT Pub. Date: Oct. 8, 2015

(65) Prior Publication Data
US 2017/0176551 A1 Jun. 22, 2017

Related U.S. Application Data

(60) Provisional application No. 61/972,951, filed on Mar. 31, 2014.

(51) Int. Cl.
*G01R 33/28* (2006.01)
*G01R 33/36* (2006.01)
*G01R 33/3415* (2006.01)

(52) U.S. Cl.
CPC ....... *G01R 33/3657* (2013.01); *G01R 33/288* (2013.01); *G01R 33/3415* (2013.01);
(Continued)

(58) Field of Classification Search
CPC ...... G01R 33/28; G01R 33/288; G01R 33/34; G01R 33/3415; G01R 33/36;
(Continued)

(56) References Cited

U.S. PATENT DOCUMENTS

| 7,501,828 B1 | 3/2009 | Wong et al. |
| 2005/0162165 A1 | 7/2005 | Nistler et al. |

(Continued)

OTHER PUBLICATIONS

Riffe et al "Power Scavenging Circuit for Wireless DC Power" Proceedings of the International Society for Magnetic Resonance in Medicine, May 19-25, 2007 p. 3273.

*Primary Examiner* — Son T Le

(57) ABSTRACT

A radio-frequency (RF) coil assembly (120, 660) for acquiring magnetic resonance (MR) signals. The RF coil assembly may include one or more of: at least one radio-frequency (RF) receive coil (246-x) for acquiring the MR signals; a detune circuit (248-x) including one or more circuit arms (A, B) serially coupled to the at least one RF receive coil, each of one or more circuit arms having at least two low-loss switches (350, 352, 450, 452, 462, 466) serially coupled to each other; a charge control circuit (372, 472) coupled to each of the one or more circuit arms at a location that is between the at least two serially-coupled low-loss switches of each of the one of more circuit arms and configured to draw power from the RF receive coil during a detune state; and an energy storage device (252, 370, 470) coupled to the charge control circuit and configured to store the drawn power.

16 Claims, 6 Drawing Sheets

(52) U.S. Cl.
CPC ..... *G01R 33/3628* (2013.01); *G01R 33/3664* (2013.01); *G01R 33/3692* (2013.01)

(58) Field of Classification Search
CPC ............ G01R 33/3657; G01R 33/3664; G01R 33/3692; G01R 33/3628
See application file for complete search history.

(56) References Cited

U.S. PATENT DOCUMENTS

| | | | |
|---|---|---|---|
| 2006/0226841 A1 | 10/2006 | Boskamp et al. | |
| 2007/0013361 A1* | 1/2007 | Burlak | H02M 1/32 324/142 |
| 2008/0231282 A1* | 9/2008 | Griswold | G01R 33/3415 324/322 |
| 2010/0090699 A1 | 4/2010 | Haans et al. | |
| 2011/0068792 A1 | 6/2011 | Iannotti et al. | |
| 2014/0070808 A1* | 3/2014 | Reykowski | G01R 33/3657 324/309 |

* cited by examiner

RECEIVE COILS WITH LOW-LOSS DETUNE CIRCUITS FOR MAGNETIC RESONANCE (MR) SYSTEMS AND METHOD OF OPERATION THEREOF

CROSS REFERENCE TO RELATED APPLICATIONS

This application is a U.S. national phase application of International Application No. PCT/IB32015/051970, filed on Mar. 18, 2015, which claims the benefit of U.S. provisional Application Ser. No. 61/972,951 filed on Mar. 31, 2014 and is incorporated herein by reference.

The present system relates to radio-frequency (RF) receive coils for magnetic resonance (MR) imaging (MRI) and spectroscopy (MRS) systems and, more particularly, to RF receive-only coils with a low-loss switch arrangement to reduce heat gain and to harness energy, and a method of operation thereof.

MRI systems include RF coils which acquire MR signals (e.g., analog or echo signals) which are then sampled and digitized. In other analog RF coils, the MR signals are amplified by the RF coils and thereafter transmitted as analog data via galvanic cables such as RF cables to a controller for further processing such as sampling and digitization to form corresponding image data during, for example, an image reconstruction process. Unfortunately, large signal losses may be experienced over long runs of the RF cables. Additionally, radiation emitted by the RF cables may expose a patient being scanned to high local SAR levels. Further, galvanic conductors such as the RF cables require expensive and ergonomically undesirable baluns to protect the patient from possible RF burns due to high currents induced by the RF transmission.

Accordingly, to avoid RF transmission over galvanic conductors, some RF coils perform analog-amplification, sampling and digitization locally within a housing of the corresponding RF coil. This may minimize signal losses associated with long RF cable runs and the digital data generated as a result of the digitization may be used locally within the RF coil, if desired. Unfortunately, these RF coils typically require direct-current (DC) power for proper operation. This DC power is generally supplied by galvanic cables, such as coaxial cables which couple the RF coil to system connector ports that provide the DC power for proper operation. Unfortunately, these galvanic cables are undesirable for at least some of the same reasons discussed above with respect to the RF cables.

To avoid use of galvanic cables, receive-only-type RF coils which generate power locally and which transmit optical data may be used. As the receive-only-type RF coils may generate power locally, external power cables such as galvanic cables to supply DC power are not required. Further, as the receive-only-type RF coils may acquire MR data from one or more receive coils and thereafter digitize and transmit the digitized data via an optical fiber cable, galvanic cables such as RF cables for transmitting analog data are also not required. Unfortunately, other receive-only-type RF coils generate heat locally which, if not dissipated properly, may cause unstable operation and lead to premature circuit failure. Further, as the receive-only-type RF coils are usually located close to, or touching, a patient being scanned, the dissipated heat may cause discomfort to the patient.

The system(s), device(s), method(s), arrangements(s), user interface(s), computer program(s), processes, etc. (hereinafter each of which will be referred to as system, unless the context indicates otherwise), described herein address problems in prior art systems.

In accordance with embodiments of the present system, there is disclosed a radio-frequency (RF) coil assembly for acquiring magnetic resonance (MR) signals. The RF coil assembly may include one or more of: at least one radio-frequency (RF) receive coil for acquiring the MR signals; a detune circuit including one or more circuit arms serially coupled to the at least one RF receive coil, each of one or more circuit arms having at least two low-loss switches serially coupled to each other; a charge control circuit coupled to each of the one or more circuit arms at a location that is between the at least two serially-coupled low-loss switches of each of the one of more circuit arms and configured to draw power from the RF receive coil during a detune state; and an energy storage device coupled to the charge control circuit and configured to store the drawn power.

It is also envisioned that the charge control circuit may further include at least one power control switch configured to selectively control the draw of power from the RF receive coil. Moreover, the at least one power control switch may be selectively controlled to control an impedance of the detune circuit. The RF coil assembly may further include a controller configured to determine whether to enter the detune state. It is further envisioned that the controller may control each of the at least two low-loss switches of each of the one or more circuit arms to be substantially non-conductive when it is determined to enter the detune state. The controller may further control each of the at least two low-loss switches of each of the one or more circuit arms to be substantially conductive when it is determined not to enter the detune state. The charge control circuit may further include at least one power control switch configured to selectively control the draw of power from the RF receive coil. It is also envisioned that the controller may control at least one power control switch to be substantially non-conductive when it is determined to not enter the detune state.

Moreover, it is envisioned that the one or more circuit arms may be coupled in parallel to each other to form a full-bridge circuit. The detune circuit may further be configured to tune the at least one RF receive coil to a resonance frequency when in a tune state and to detune the at least one RF receive coil when in the detune state.

In accordance with yet other embodiments of the present system, there is disclosed a radio-frequency (RF) coil assembly for acquiring magnetic resonance (MR) signals, and including: at least one radio-frequency (RF) receive coil for acquiring the MR signals; a detune circuit including two circuit arms serially coupled to the at least one RF receive coil and coupled in parallel to each other, each of the two circuit arms having at least two low-loss switches serially coupled to each other; and/or a charge control circuit including an energy storage device configured to store power, the charge control circuit may be coupled to each of two circuit arms at a location that is between the at least two serially-coupled low-loss switches of each of the two circuit arms and may be configured to draw power from the at least one RF receive coil and store the drawn power in the energy storage device.

It is also envisioned that the charge control circuit may further include at least one power control switch which is coupled between one of the two circuit arms and the energy storage device to control the draw of power from the RF receive coil. A controller may be provided and configured to selectively control the draw of power from the RF receive coil by controlling a duty cycle of the at least one power control switch. For example, the controller may be configured to selectively control an impedance of the detune circuit by controlling a duty cycle of the at least one power control switch. It is also envisioned that the RF coil assembly may further include a housing configured to contain the at least one RF receive coil, the detune circuit and the charge control circuit. Further, processing of the echo data may occur within the housing so that, for example, an output of the housing may include reconstructed data such as image data. The controller may be configured to control each of the at least two low-loss switches of each of the two circuit arms to be substantially conductive during a tune state and substantially non-conductive during a detune state. It is also envisioned that the detune circuit may be configured to tune the at least one RF receive coil to a resonance frequency when in a tune state and to detune the at least one RF receive coil when in a when in a detune state.

In accordance with yet further embodiments of the present system, there is disclosed a magnetic resonance (MR) system including: at least one main magnet for generating a main magnetic field including a substantially homogenous magnetic field within a scanning volume, a radio frequency (RF) portion including RF transmit coils configured to output RF pulses, and an RF reception portion configured to acquire MR signals from the scanning volume during a tune state and to digitize the acquired MR signals within a housing of the RF reception portion. The RF reception portion may include: at least one radio-frequency (RF) receive coil for acquiring the MR signals, a detune circuit coupled to the at least one RF receive coil and configured to detune the at least one RF receive coil during a detune state, and an energy storage portion configured to store energy from the at least one RF receive coil when the RF reception portion is in the detune state and to be decoupled from the at least one RF receive coil when the RF reception portion is in the tune state.

In accordance with embodiments of the present system, the RF reception portion may include a plurality of channels with one or more of the plurality of channels including at least one of: the at least one radio-frequency (RF) receive coil, the detune circuit, and the energy storage portion. It is also envisioned that the energy storage portion may further include a switch with a duty cycle that is controlled to control an amount of energy stored in the storage portion when in the detune state.

The present invention is explained in further detail in the following exemplary embodiments and with reference to the figures, where identical or similar elements are partly indicated by the same or similar reference numerals, and the features of various exemplary embodiments being combinable. In the drawings.

The following are descriptions of illustrative embodiments that when taken in conjunction with the following drawings will demonstrate the above noted features and advantages, as well as further ones. In the following description, for purposes of explanation rather than limitation, illustrative details are set forth such as architecture, interfaces, techniques, element attributes, etc. However, it will be apparent to those of ordinary skill in the art that other embodiments that depart from these details would still be understood to be within the scope of the appended claims. Moreover, for the purpose of clarity, detailed descriptions of well known devices, circuits, tools, techniques, and methods are omitted so as not to obscure the description of the present system. It should be expressly understood that the drawings are included for illustrative purposes and do not represent the entire scope of the present system. In the accompanying drawings, like reference numbers in different drawings may designate similar elements.

Figure 1:
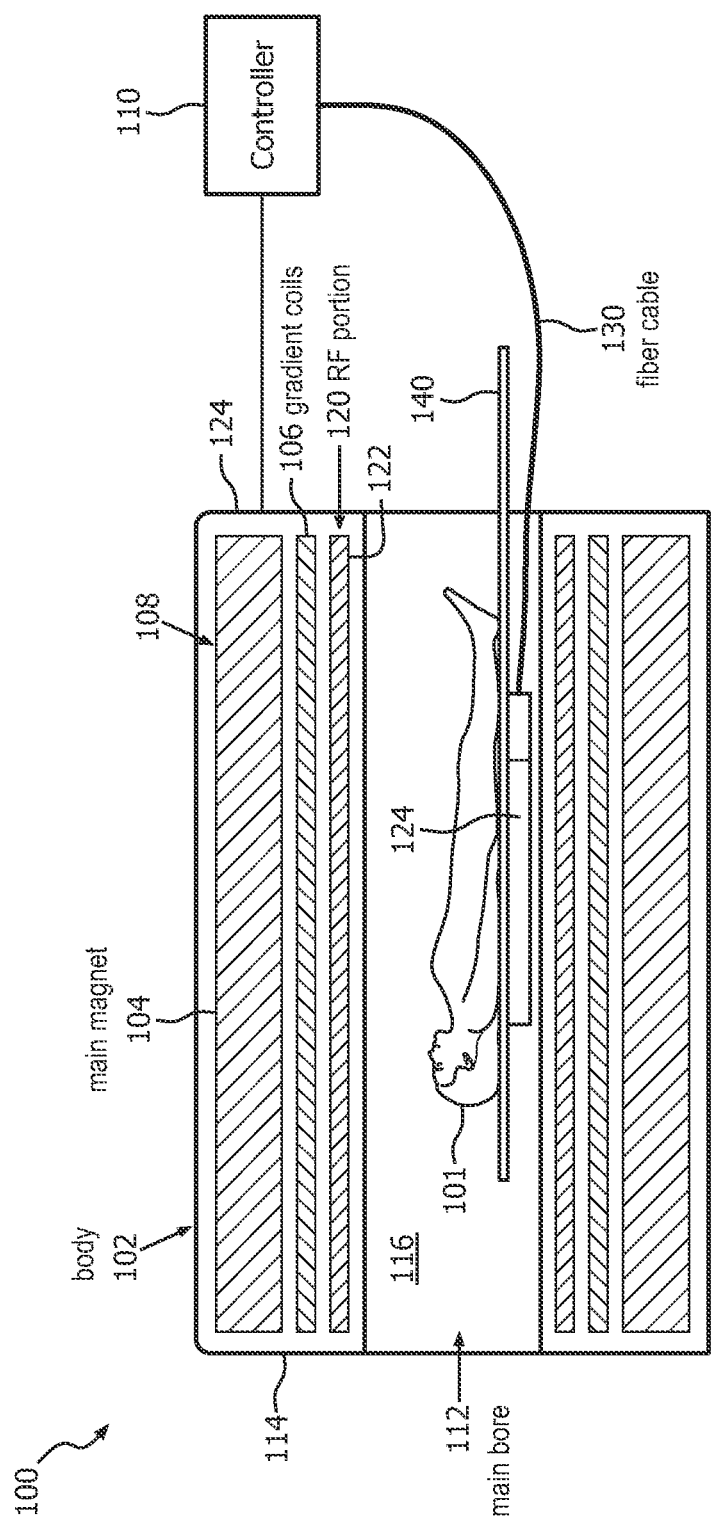
FIG. 1 shows a cutaway side view of a portion of an MR system with an RF portion operating in accordance with embodiments of the present system.

FIG. 1 shows a cutaway side view a portion of an MR system 100 (hereinafter system 100 for the sake of clarity) with an RF portion 120 operating in accordance with embodiments of the present system. The system 100 may include one or more of a controller 110, a memory, a display, a body 102, a main magnet 104, gradient coils 106, and an RF portion 120. A patient support 140 may be provided to support an object of interest such as a patient 101 and/or to position the patient 101 in a desired position and/or orientation in relation to the body 102 under the control of the controller 110.

The body 102 may include at least one cavity 108 and a main bore 112 situated between opposed ends 114. The main bore 112 may be configured to receive the object of interest such as the patient 101 (e.g., a human patient, etc.). The at least one cavity 108 may be configured to receive one or more of the main magnet 104, the gradient coils 106, and at least a portion of the RF portion 120. The body 102 may further include a cooling mechanism (e.g., a cryogenic cooling system, etc.) configured to cool portions of the system 100 such as the main magnet 104, if desired.

The controller 110 may control the overall operation of the system 100 and may include one or more logic devices such as processors (e.g., micro-processors, etc.) etc. The controller 110 may operate as one or more of a main magnet controller, a gradient controller, an RF controller, and a reconstructor. The main magnet controller may control the operation of the main magnets. The gradient controller may control the operation of the gradient coils 106. The RF controller may control the operation of the RF portion 120. The reconstructor may obtain digitized data based upon acquired echo data and reconstruct digitized data to form desired data such as image data, spectrographic data, location data, etc. for example, for storage and/or rendering on a rendering device (e.g., see, FIG. 6). The controller 110 may further determine or otherwise obtain scan sequences, scan parameters, etc. and apply them during a scanning procedure. For example, the controller 110 may obtain a scan sequence from the memory and control, for example, the gradient coils 106 and/or RF portion 120 accordingly.

The main magnet 104 may have a bore and may be configured to generate a main magnetic field (e.g., a $B_0$ field) within the main bore 112. The main magnetic field may be substantially homogenous within a scanning volume 116 of the main bore 112. The main magnet 104 may include one or more main magnets each configured to generate at least a portion of main magnetic field. The main magnet 104 may be an annular (e.g., ring) magnet. However, in yet other embodiments, the main magnet may include any suitable magnet or magnets such as an annular or ring magnet, a planar magnet, a split magnet, an open magnet, a semicircular magnet (e.g., a C-shaped magnet, etc. The main magnet 104, or portions thereof, may be formed from any suitable material such as a superconducting material and/or may operate under the control of the controller 110.

The gradient coils 106 may include one or more gradient coils (e.g., x-, y-, and z-gradient coils) which may produce one or more gradient fields along one or more corresponding axes under the control of the controller 110.

The RF portion 120 may include one or more of RF coils such at least one RF coil portion (assembly) 122 and at least one receive-only RF coil portion 124. However, for the sake of clarity only a single RF coil portion 122 and only a single receive-only RF coil portion 124 is described. The RF coil portion 122 may include a plurality of RF transmission coils configured to transmit RF excitation pulses and/or receive (induced) MR signals (e.g., echo data) under the control of the controller 110. The RF coil portion 122 may be situated in a fixed location within the body 102, if desired, and may operate under the control of the controller 110.

The receive-only RF coil portion 124 may be of a receive RF-type to receive MR signals and may include one or more receive loops (such as a receive loop array), a detune switch portion associated with each receive loop, a power storage portion, and a processing portion in accordance with embodiments of the present system. Each receive loop may include a conductive radio-frequency (RF) coil configured to resonate at one or more desired frequencies. The receive RF coil portion 124 may be configured to operate in accordance with embodiments of the present system. More particularly, the receive RF coil portion 124 may have two or more operative states such as a tune state and a detune state.

In the tune state, the detune switch portion may be operative to tune the one or more receive loops so that they may acquire MR signals (hereinafter echo data for the sake of clarity). Thereafter, regardless of state, the receive-only RF coil portion 124 may locally sample the echo data and digitize the sampled echo data to form corresponding digital data (e.g., k-space data). The digital data may then be reconstructed to form reconstructed MR data such as image data, spectrographic data, location data (e.g., for MR guided interventional procedures), etc. The digital data and/or the reconstructed MR data may be transmitted from the receive-only RF coil portion 124 using any suitable optical and/or wireless communication method. For example, an optical fiber cable 130 may be provided to couple the receive-only RF coil portion 124 to the controller 110. By using wireless and/or optical communication methods, the use of galvanic conductors such as RF cables may be avoided.

In the detune state, the detune switch portion may be configured to detune the receive loops using any suitable method. For example, during the detune state, the switch portion may increase impedance (e.g., by opening switches to form an open circuit) so that a resonance frequency of a corresponding receive loop is shifted and thus, the receive loop is effectively decoupled from the RF transmission coils when the latter are transmitting (e.g., during an RF transmission period). Accordingly, this may protect sensitive circuitry which may be damaged by large currents that may be induced in the receive loops if these loops couple to the transmit coils during an RF transmission period. Further, when the switch portion detunes the receive loops, the switch portion may wirelessly harvest induced energy from the receive loops and/or store this energy in a local power storage portion (PSP) such as a battery, a super-capacitor, and/or the like.

Figure 2:
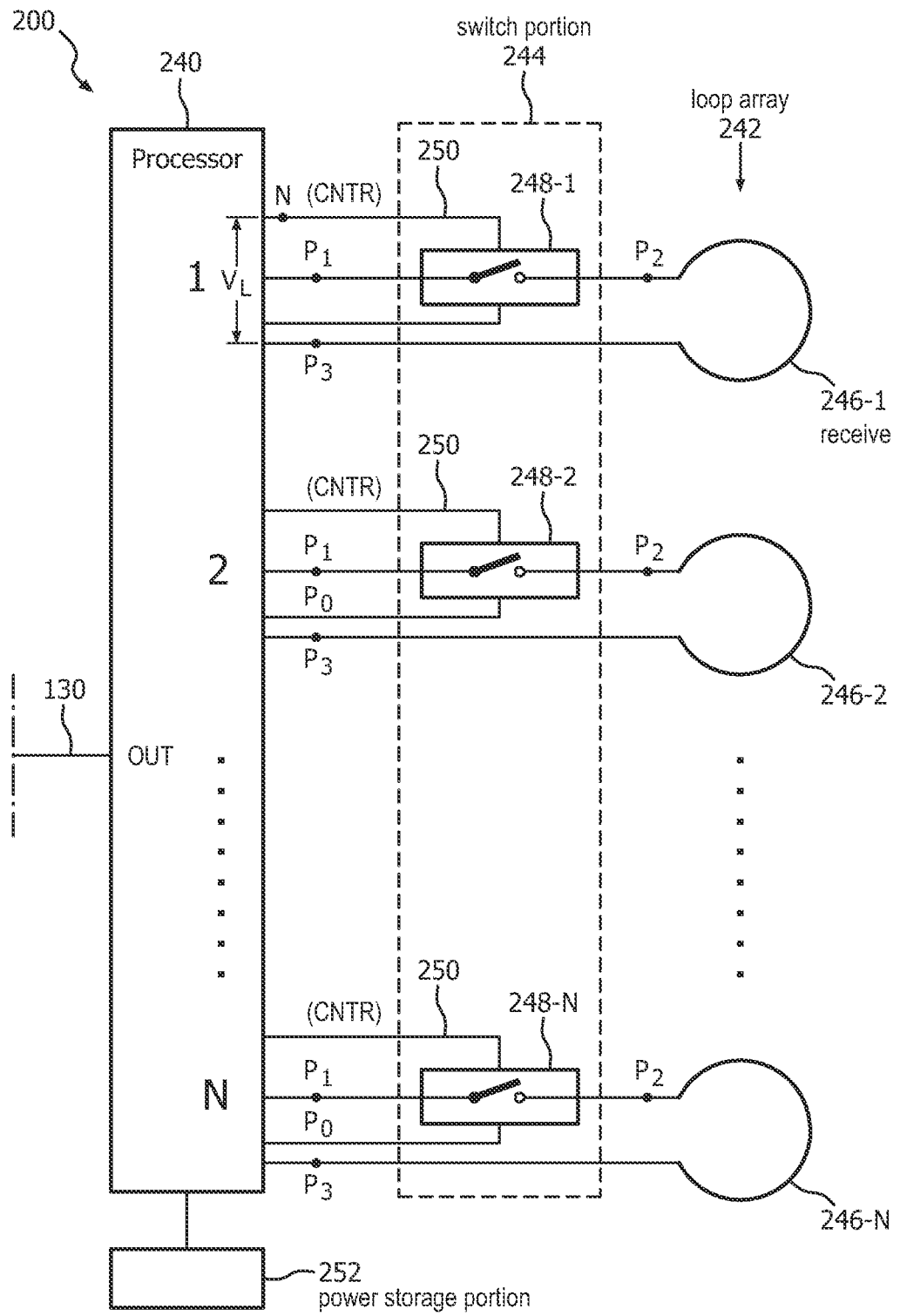
FIG. 2 shows a schematic view of a portion of the receive-only RF portion in accordance with embodiments of the present system.

FIG. 2 shows a schematic view of a portion of the receive-only RF portion 200 in accordance with embodiments of the present system. The receive-only RF portion 200 may be similar to the receive-only portion 124 and may include a processor 240 with one or more channels (e.g., N channels, etc.) each coupled to a loop circuit including at least one receive loop 246-$x$ of receive loops 246-1 through 246-N (generally 246-$x$) and a corresponding coupled (e.g., serially or otherwise coupled) low-loss switch circuit (LLS) 248-1 through 248-N (generally 248-$x$), respectively, of a loop array 242. The LLSs 248-$x$ may be configured to control impedance of a corresponding receive loop 246-$x$ to tune or detune each corresponding receive loop 246-$x$ during tune or detune states, respectively. For example, during a tune state the impedance of an LSS 248-$x$ may match an impedance of one or more receive loops 246-$x$ coupled (e.g., serially or otherwise coupled) thereto. In accordance with embodiments of the present system, detune circuit blocking impedances illustratively may range from about 2000 to 4000 ohms so that induced currents in the coil loops are safe and/or non-interfering during a transmit phase. Accordingly, each of the LSSs 248-$x$ may be configured to operate as an RF tune/detune circuit. For example, during the detune state, the LLSs 248-$x$ may be configured to detune the corresponding receive loops 246-$x$ and store energy due to induced currents in the receive loops 246-$x$ in the energy storage portion 252. Then, during the tune state, the LSSs 248-$x$ may be configured to tune the corresponding receive loops 246-$x$ and acquire analog data such as echo data from each of the corresponding receive loops 246-$x$. The processor 240 may include signal processing portions which may amplify, condition, and/or sample signals (e.g., echo data) which are acquired by and output from each of the receive loops 246-$x$ associated with a corresponding channel. As discussed above, the processor 240 may then sample the echo data and thereafter digitize the sampled echo data to form corresponding digital data. The digital data may then be reconstructed to form reconstructed MR data such as image data, spectrographic data, location data, etc., depending upon a type of MR process being performed (e.g., MRI, MRS, etc.). The digital data and/or reconstructed MR data may then be transmitted to the controller 110 using any suitable optical or wireless communication method. For example, the reconstructed MR data may then be transmitted to the controller 110 using the optical fiber cable 130.

The processor 240 may selectively output a control signal (CNTR) via a control lead 250 to control each of the LSSs 248-$x$ to enter the tune or detune states and/or to selectively harvest energy from currents induced in a corresponding receive loop 246-$x$. During the detune state, the LSSs 248-$x$ may insert a high impedance into one or more of the coil loops formed by the LSSs 248-$x$ and one or more of the corresponding receive loops 246-x as measured between terminals (e.g., ports or nodes) P1 and P2. The harvested energy may then be stored in an energy storage portion (ESP) 252 which may include any suitable energy storage device such as a battery, a capacitor (e.g., a super-capacitor) an inductor, and/or the like. Further, the harvested energy may be utilized to energize one or more portions of the system at the time of harvesting and/or thereafter being stored in the ESP 252.

During RF transmission periods, the LSSs 248-x are controlled to enter the detuned state (e.g., a high impedance state) to detune and decouple the receive coils 246-x from the processor 240. Accordingly, sensitive electronic circuitry in the receive coils 246-x and/or the processor 240 coupled thereto are protected from currents induced in receive coil 246-x. Regardless of the operating state, the LSS 248-x provides a much higher impedance than the impedance of the receive coil 246-x and therefore a voltage which falls across the receive coil 246-x and the, for example, serially coupled LSS 248-x (e.g., a loop voltage ($V_L$)) may be assumed to fall across the LSS 248-x. The LSS 248-x may form a passive resonant circuit including at least one diode configured to provide a capacitive reactance in the receive state and a resistance which is significantly higher than (e.g., fifty (50) times higher) the capacitive reactance in the detune state. When the LSS 248-x is substantially not conducting, the loop voltage ($V_L$) may be assumed to be an open circuit voltage ($V_o$). The power dissipated ($P_{dis}$) locally within the LSS 248-x (e.g., when the LSS 248-x is substantially not conducting) may be assumed to be equal to the open circuit voltage squared ($V_o^2$) divided by the effective resistance of the trap ($R_{trap}$), wherein, $R_{trap}$ may be expressed as $R_{trap}=(2pi*freq*L)^2/(Rind+Rdiode)$, and $P_{dis}$ may be expressed as:

$$P_{dis}=V_o^2/R_{trap},$$

where freq refers to an operating frequency of the switches, L refers to inductance (H) across a corresponding switch (e.g., a corresponding switch 248-x), Rind refers to the series loss resistance of the corresponding inductor L, Rdiode refers to the series loss resistance of the diode.

Rather than dissipating this power locally within the LSS 486-x (e.g., $P_{dis}$) which may cause localized heating which is undesirable and may result in premature circuit failure if not dissipated correctly, embodiments of the present system may store this power in a power storage portion such as the ESP 252. In accordance with some embodiments, capacitance of an FET trap may illustratively vary from about 8 pF to about 50 pF over a voltage range of about 10 to 300 V.

Low-loss switch circuits will now be described with reference to FIGS. 3 through 5. However, as a plurality of low-loss switch circuits may be similar to each other, only a single low-loss switch circuit for each of a plurality of low-loss switch circuits in accordance with embodiments of the present system will be described for the sake of clarity.

Figure 3:
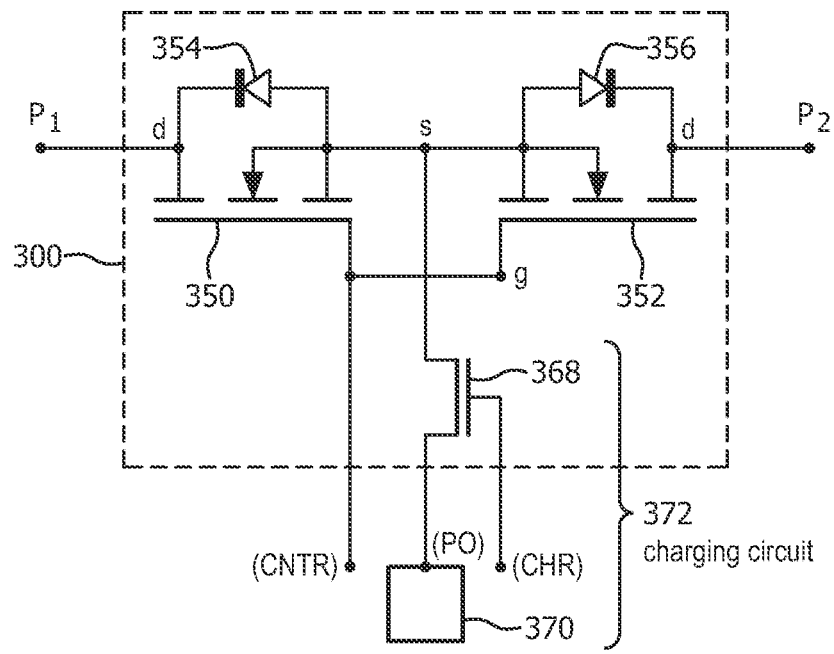
FIG. 3 shows a detailed view of a portion of a low-loss switch circuit (LLS) of a loop array using a half-bridge configuration operating in accordance with embodiments of the present system.

FIG. 3 shows a detailed view of a portion of a low-loss switch circuit (LLS) 300 (e.g., a detune circuit or trap) of a loop array using a half-bridge configuration operating in accordance with embodiments of the present system. When in a detune state, low-loss switches 350 and 352 and corresponding anti-parallel diodes 354 and 356 may controllably insert high impedance into at least one receive loop 246-x coupled thereto (e.g., serially or otherwise coupled) in place of other detune circuits. If the off-resistance is substantially higher (e.g., when measured between terminals P1 and P2) than the off-resistance of other detune circuits (e.g., a diode-based detune circuit) then some power acquired through induction in the receive loops 246-x coupled to the detune circuit (e.g., serially or otherwise coupled) during the detune state (e.g., where the detune state is synched to occur with a transmit phase of transmit RF coils such as the RF coils 122), may be transmitted (e.g., at a load terminal (LOAD)) to an energy storage device (e.g., the ESP 252). In accordance with embodiments of the present system, the LLS 300 may include a switch formed by switches coupled thereto (e.g., serially or otherwise coupled) such as field effect transistors (FETs) 350 and 352 and anti-parallel diodes 354 and 356 coupled across the FETs 350 and 352, respectively. In accordance with these embodiments, the FETs 350 and 352 may be configured to be normally off. Accordingly, when a control voltage (CNTRL=hi) is applied to the gates of the FETs 350 and 352 they may conduct. However, when no control voltage (CNTRL=low) is applied to the gates of the FETs 350 and 352, they may be substantially non-conductive. Assuming that in the detune state no control voltage is applied (e.g., CNTRL=low) and in the tune state a control voltage is applied (CNTRL=high). Then, when no control voltage is applied, the FETs 350 and 352 would be substantially non-conductive and both diodes 354 and 356 will function as rectifiers to block large positive or negative voltages applied across terminals P1 and P2. More particularly, one diode of the diodes 354 and 356 would block a large positive voltage (e.g., across terminals P1 and P2) and the other diode of the diodes 354 and 356 would block a large negative voltage (e.g., across terminals P1 and P2). Thus, in this case, the LLS 300 may be considered be to be normally-off switch with a high impedance across terminals P1 and P2. However, when a control voltage is applied to the gated of the FETs 350 and 352, these FETs will become substantially conductive and both diodes 354 and 356 will function as shorts and the LLS 300 may be considered to be a closed switch with only relatively low impedance across terminals P1 and P2. Unlike other detune circuits, in the receive state the LSS 300 will be very close to a short (e.g., substantially conductive) while in the off state it will have some capacitance. In accordance with embodiments of the present system, this capacitance may be tuned with an inductor placed across the terminals (e.g., see, L1, FIG. 7)) to maximize the impedance at a particular frequency such as at a tuning frequency ($f_t$). However, in accordance with other embodiments of the present system, for example, in embodiments where the capacitance of the switch in the off-state is low, an inductor may not be utilized. When in the detune state (e.g., in an off state), energy due to induced currents in one or more of the coupled receive loops 246-x may be drawn by a charging circuit 372 to be stored in energy storage portion 370 operating in accordance with embodiments of the present system. The charging circuit 372 may be coupled between the low-loss switches 350 and 352. In accordance with embodiments of the present system, a duty cycle of the power control switch 368 may be varied to control power supplied to the power storage portion 370. For example, a charge signal (CHR) may be generated by a controller of the system, such as the processor 240, to control operation (conductivity) of the power control switch 368 to vary a duty cycle of the power control switch 368 which in effect may control an amount of charge delivered to the load 370. Additionally, by controlling the duty cycle of the power control switch 368, the impedance of the LSS 300 and, thus, the receive loop 348-x coupled thereto may also be varied.

As shown in FIG. 3, the low-loss switch circuit 300 may include at least two low-loss switches arranged in a half-bridge configuration. However, in yet other embodiments, the low-loss switch circuit 300 may include for example four low-loss-switches arranged in a bridge configuration with an optional switch in series with a load as will be described with regard to FIG. 4.

Figure 4:
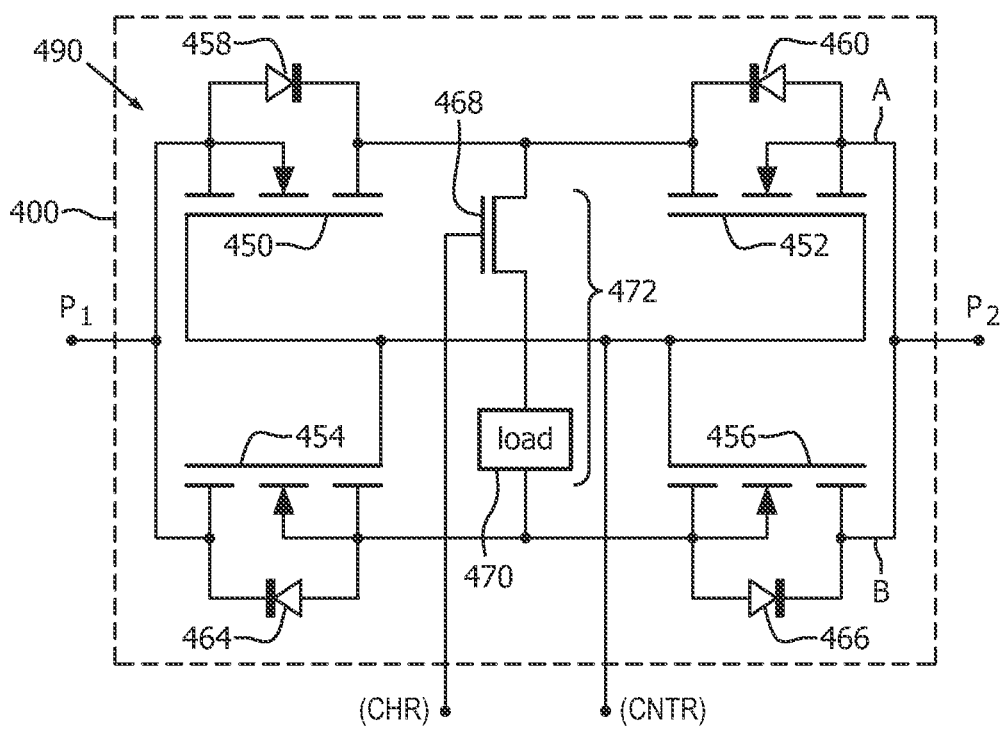
FIG. 4 shows a detailed view of a portion of a low-loss switch circuit (LLS) of the loop array using a full-bridge configuration operating in accordance with embodiments of the present system.

FIG. 4 shows a detailed view of a portion of a low-loss switch circuit (LLS) 400 of the loop array 242 using a full-bridge configuration operating in accordance with embodiments of the present system. The LSS 400 may include a bridge 490 having first and second legs (e.g., rings) A and B, respectively, which are coupled in parallel across terminals P1 and P2. The first leg A may include a plurality of coupled low-loss switches (e.g., serially or otherwise coupled FETs or the like) 450 and 452 configured in an anti-parallel manner. The second leg B may include a plurality of coupled low-loss switches 454 and 456 (e.g., serially or otherwise coupled) which are similarly configured in an anti-parallel manner. The low-loss switches 450, 452, 454, and 456 may be considered ring switches and may include normally closed FETs or the like. Gates (g) of each of the low-loss switches 450, 452, 454, and 456 are commonly coupled to a control signal (CNTRL) which is controlled by a controller such as the processor 240. Diodes 458 and 460 are shown coupled in an antiparallel manner across the low-loss switches 450 and 460, respectively, of the first leg A. Further, diodes 464 and 466 are coupled in an antiparallel manner across the low-loss switches 454 and 456, respectively, of the second leg B. A time division multiplexing (TDM) method using a time-division multiplexor may be used to provide for charging during a portion of the transmit period which presents a relatively low impedance, with blocking action during other times. By setting the relative amount of time for charging versus blocking, a lower (but adequate) average blocking impedance may be produced. For example, an additional switch, controlled by some local intelligence (e.g. ARM controller, microprocessor, etc.) or by an analog comparison (e.g., using a comparator and fixed voltage for example) may be utilized to bring the load e.g., using the control signal (CNTRL), into the circuit at intervals designed to make the average current in the loop remain above a safe level while extracting as much energy as possible given this constraint.

A charging circuit 472 may include one or more of a load 470 coupled to a power control switch 468 (e.g., a serially or otherwise coupled center leg switch) and may be coupled in parallel to the low-loss switches 450 and 460 of the first leg A and to the low-loss switches 454 and 456 of the second leg B. The charging circuit 472 may form a center leg of the bridge 490. A duty cycle of the power control switch 468 may varied to control power supplied to the load 470 which may include a power storage portion. A charge signal (CHR) may be generated by a controller of the system such as the processor 240 to control operation (conductivity) of the power control switch 468 to vary a duty cycle of the power control switch 468 which, in effect, controls an amount of charge delivered to the load 470. By controlling the duty cycle, the impedance of the LSS 300 may also be varied. The power storage portion may include any suitable power storage device such as a battery, a capacitor, or the like. However, for the sake of clarity, it will be assumed that the power storage portion uses at least one battery. Further, the at least one battery may include a single battery for a plurality of channels (e.g., for central power storage) or a battery for each channel of a plurality of channels.

In the tune state, the control signal (CNTRL) may close each of the low-loss switches 450, 452, 454, and 456 (e.g., the ring switches) so that the LSS 400 may be operative as a closed switch across terminals P1 and P2. However, in the detune state, the control signal (CNTRL) may open each of the low-loss switches 450, 452, 454 (of the ring) so that the LSS 248-$x$ may be operative as an open switch with a highest maximum impedance across terminals P1 and P2 when the power control switch 468 is open. Further, a lower maximum impedance may be provided across the terminals P1 and P2 when the power control switch 468 is closed and delivering power to the load 470. In other words, in the off state, the impedance of the LSS 400 (e.g., across terminals P1 and P2) may be assumed to be a maximum impedance (e.g., 10,000 ohms) when the charge control switch 468 is open and thus no power is flowing to the load 470. However, when in the detune-state, the effective maximum resistance of the LSS 248-$x$ may decrease based upon an amount of power supplied to the load 470. Thus, in the detune-state, the effective maximum resistance of the LSS 268-$x$ may be variably lowered by controlling the duty cycle of the power control switch 468 to control an amount of power delivered to the load 470.

In accordance with embodiments of the present system, a low-loss switch circuit (e.g., LSS 400) may include a modified full-bridge detune circuit to obtain efficient RF energy harvesting with detune functionality. In this implementation, all ring switches (e.g., the low-loss switches 450, 452, 454, and 456) of the full-bridge detune circuit may share a common control signal (CNTRL) to produce rectifier diode functionality when a control signal voltage is off (e.g., CNTRL=low). If a switch in a center leg of the full-bridge detune circuit (e.g., the power control switch 468) is also off, the full-bridge detune circuit may be considered to be two switches (e.g., two serially coupled ring switches) in parallel with another two switches (e.g., two other serially coupled ring switches) thus producing the desired off impedance. If a charge control signal (CHR) for the switch in the center leg is selectively activated (e.g., closed or otherwise conducting), then diodes of the rings may operate as a full wave rectifier delivering DC power to a charging port coupled to a load (e.g., a battery, a capacitor, etc.). Fine temporal modification of the charge control signal (CHR) may allow a desired amount of power to be extracted from a receive coil coupled to the full-bridge detune circuit. When the control signal (CNTRL) closes the ring switches, the LSS acts as a short (e.g., between terminals P1 and P2) so that the receive coil may be used to receive induced MR signals in the tune state (e.g., corresponding with a receive mode). During the receive mode, the charge control signal (CHR) is not activated so that the switch in the center leg is open.

Figure 5:
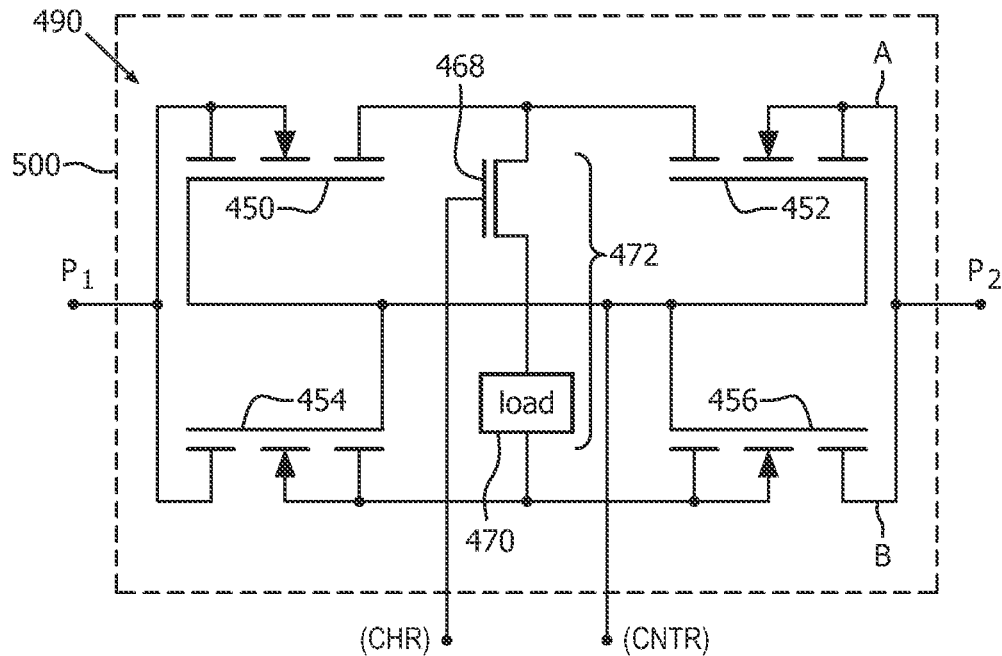
FIG. 5 shows a detailed view of a portion of a low-loss switch circuit (LLS) of the loop array using a full-bridge configuration operating in accordance with embodiments of the present system.

FIG. 5 shows a detailed view of a portion of a low-loss switch circuit (LLS) 500 of the loop array 242 using a full-bridge configuration operating in accordance with embodiments of the present system. The LSS 500 is essentially similar to the LSS 400 described above and similar reference numerals are provided. However, as the diodes 458, 460, 464, and 466 (which are mounted in parallel with the low-loss switches 450, 452, 454, and 456, respectively of FIG. 4) of the LSS 400 are not provided, more precise control of the low-loss switches 450, 452, 454, and 456 and the power control switch 468 is desired to extract power from the receive loop storage during the detune state. By controlling the low-loss switches 450, 452, 454, and 456 and the power control switch 468 in coordination with the RF phase of the receive loop it is possible to route the excess power from the receive loop to the load 470 which is an energy storage portion such as a battery, a capacitor, etc. However, in yet other embodiments, the power control switch 468 may not be provided as control of the low-loss switches 450, 452, 454, and 456 may be sufficient to control power deliver from the receive loop to the load to deliver a selected amount of charge to the load 470 and may control impedance of the LSS 400.

A charging circuit 472 may include one or more of a load 470 coupled to a power control switch 468 (e.g., serially or otherwise coupled to) and may be coupled in parallel to the low-loss switches 450 and 460 of the first leg A and to the low-loss switches 454 and 456 of the second leg B. The charging circuit 472 may form a center leg of the bridge 490. A duty cycle of the power control switch 468 may varied to control power supplied to the load 470. A charge signal (CHR) may be generated by a controller of the system such as the processor 240 to control operation (conductivity) of the power control switch 468 to vary a duty cycle of the power control switch 468 which, in effect, controls an amount of charge delivered to the load 470. The load 470 may be located locally or remotely from the LSS. For example, in some embodiments, the load 470 may be located within a body of the RF coil portion 124 and may receive a charge from one or more of a plurality of LSSs.

Accordingly, embodiments of the present system may include at least two low-loss switches in a half- or full-bridge configuration with an additional power supply switch coupled in series with a load and coupled to a point that it is between a common connection point (e.g., a midpoint (M)) of the two low-loss switches. When configured as a full-bridge (e.g., as shown in FIGS. 4 and 5) the LSS (400, 500) may provide functionality as a full wave rectifier where the load inside the bridge may be considered to be the charging circuit (e.g., 472) including an energy storage portion. The controllable feature of the power control switch may permit time-domain control of a power extraction duty cycle and may controllably provide an arbitrary effective resistance substantially up to the maximum impedance of the LSS (as measured in the detune state) when the power control switch is open. However, when the power control switch is closed, the effective maximum impedance of the LSS may be lowered based at least in part upon a duty cycle of the power control switch. Thus, the relative time percentage of charge vs block may provide the effective impedance.

For example, assuming that the impedance of the LSS (e.g., across terminals P1 and P2) in the fully-off state (e.g., all low-loss switches of the rings are open) is 10,000 ohms and that a minimum loop-trap detune resistance only requires 2500 ohms for safe operation, then the effective resistance of the LSS may be lowered (e.g., from 10,000 ohms) to the minimum loop-trap detune resistance of 2500 ohms by selectively delivering power available to the receive loop to the power storage portion for storage and later use such as by internal circuitry of the receive-only RF coil. In accordance with embodiments of the present system, this may not detrimentally affect the operation of the receive-only RF coil in comparison to other detune methodologies and may reduce circuit heating. This may provide for the harvesting of energy that would otherwise be dissipated as heat in other detune circuits thereby avoiding undesirable localized heating and corresponding patient discomfort. Furthermore, as the minimum loop-trap detune resistance is generally dictated by circuit heating concerns (as opposed to image quality or patient safety), by reducing circuit heating, the minimum loop-trap detune resistance for embodiments of the present system may be less than the minimum loop-trap detune resistance of other detune circuits.

It is further envisioned that other diode-based detune circuits (e.g., diode-based loop traps) may also be used with a charging circuit operating in accordance with embodiments of the present system. The charging circuit may include a switch serially coupled to a load such as a battery, a capacitor, etc. A duty cycle of the power control switch may be varied to control power supplied to the load. A charge signal (CHR) may be generated by a controller of the system such as the processor to control operation (conductivity) of the power control switch to vary a duty cycle of the power control switch which, in effect, controls an amount of charge delivered to the load. The power delivered to the load will decrease the effective RF resistance of the receive coil, which means the receive coil will not have as low an RF current in the tuned state (e.g., during RF transmit) as may be desired. However, the inherent resistance of the LSS (e.g., without the load) may be increased (when compared to other detune circuits) to overcome any decrease in effective resistance due to power delivered to the load. Thus, a detune trap with an inherently higher effective resistance may be an enabling element for extracting energy "for free."

Figure 6:
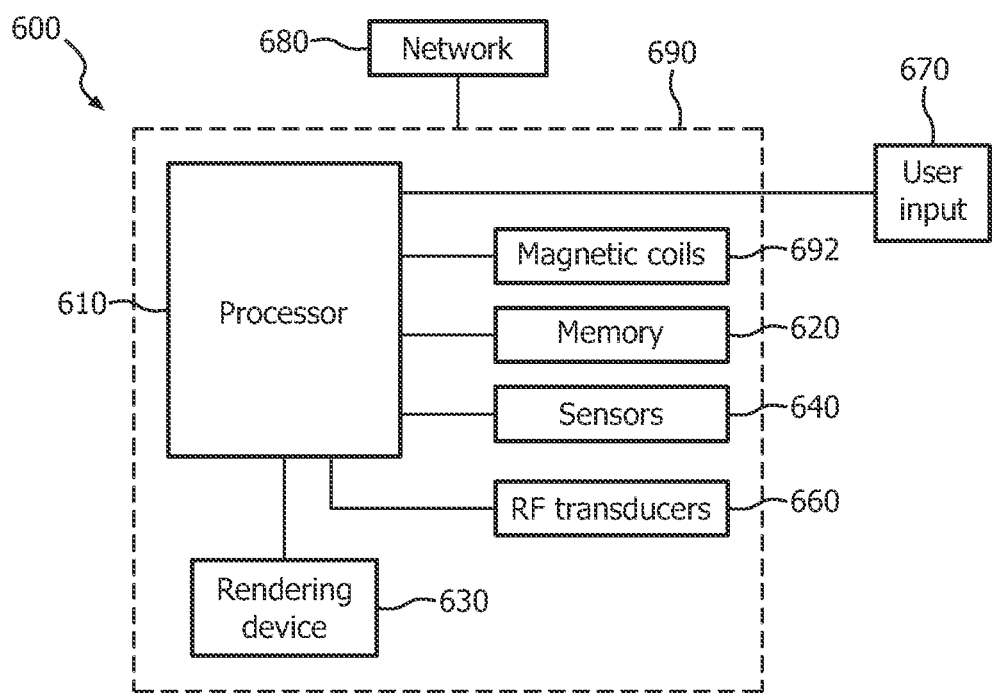
FIG. 6 shows a portion of a system in accordance with embodiments of the present system.

FIG. 6 shows a portion of a system 600 in accordance with embodiments of the present system. For example, a portion of the present system may include a processor 610 (e.g., a controller) operationally coupled to a memory 620, a rendering device such as a display 630, sensors 640, RF portion 660, magnetic coils 692, and a user input device 670. The memory 620 may be any type of device for storing application data as well as other data related to the described operation. The application data and other data are received by the processor 610 for configuring (e.g., programming) the processor 610 to perform operation acts in accordance with the present system. The processor 610 so configured becomes a special purpose machine particularly suited for performing in accordance with embodiments of the present system.

The operation acts may include configuring an MRI system 690 that may be enclosed by a housing by, for example, controlling optional support actuators, the magnetic coils 692, and/or the RF portion 660. The support actuators may control a physical location (e.g., in x, y, and z axes) of a patient, if desired. The RF portion 660 may be controlled by the processor 610 to control RF transducers such as RF transmission coils and RF reception coils, and RF states (modes) such as tune/detune states. The magnetic coils 692 may include main magnetic coils, gradient coils (e.g., x-, y-, and z-gradient coils), etc., and may be controlled to emit a main magnetic field and/or gradient fields in a desired direction and/or strength. The controller may control one or more power supplies to provide power to the magnetic coils 692 so that a desired magnetic field is emitted at a desired time. The RF transducers 660 may be controlled to transmit RF pulses at the patient during a detune state and/or to receive echo data therefrom during a tune state. A reconstructor may process received signals such as the (MR) echo data and transform the received signals (e.g., using one or more reconstruction techniques of embodiments of the present system) into content which may include image data (e.g., still or video images (e.g., video data)), data, and/or graphs that may be rendered on a rendering device, for example, including a user interface (UI) of the present system such as on the display 630. Further, the content may then be stored in a memory of the system such as the memory 620 for later use. Thus, operation acts may include requesting, providing, and/or rendering of content such as, for example, reconstructed image data obtained from the echo data.

The user input 670 may include a keyboard, a mouse, a trackball, or other device, such as a touch-sensitive display, which may be stand alone or be a part of a system, such as part of an MRI system, a personal computer, a personal digital assistant (PDA), a mobile phone (e.g., a smart phone), a monitor, a smart- or dumb-terminal or other device for communicating with the processor 610 via any operable link. The user input device 670 may be operable for interacting with the processor 610 including enabling interaction within a UI as described herein. Clearly the processor 610, the memory 620, display 630, and/or user input device 670 may all or partly be a portion of a computer system or other device such as an MRI system in accordance with embodiments of the present system.

The methods of the present system are particularly suited to be carried out by a computer software program, such program containing modules corresponding to one or more of the individual steps or acts described and/or envisioned by the present system. Such program may of course be embodied in a computer-readable medium, such as an integrated chip, a peripheral device or memory, such as the memory 620 or other memory coupled to the processor 610.

The program and/or program portions contained in the memory 620 may configure the processor 610 to implement the methods, operational acts, and functions disclosed herein. The memories may be distributed, for example between the clients and/or servers, or local, and the processor 610, where additional processors may be provided, may also be distributed or may be singular. The memories may be implemented as electrical, magnetic or optical memory, or any combination of these or other types of storage devices. Moreover, the term "memory" should be construed broadly enough to encompass any data able to be read from or written to an address in an addressable space accessible by the processor 610. With this definition, data accessible through a network 680 is still within the memory, for instance, because the processor 610 may retrieve the data from the network for operation in accordance with the present system.

The processor 610 is operable for providing control signals and/or performing operations in response to input signals from the user input device 670 as well as in response to other devices of a network and executing instructions stored in the memory 620. The processor 610 may include one or more of a microprocessor, an application-specific or general-use integrated circuit(s), a logic device, etc. Further, the processor 610 may be a dedicated processor for performing in accordance with the present system or may be a general-purpose processor wherein only one of many functions operates for performing in accordance with the present system. The processor 610 may operate utilizing a program portion, multiple program segments, or may be a hardware device utilizing a dedicated or multi-purpose integrated circuit. Embodiments of the present system may provide fast imaging methods to acquire and reconstruct images. Suitable applications may include imaging systems such as magnetic resonance imaging (MRI) systems.

In accordance with embodiments of the present system, as power generation and signal processing are performed locally within the RF portion, galvanic cables for DC power and RF transmission are not required. This may prevent exposure of a patient to SAR due to RF emissions from the galvanic cables and may reduce patient SAR exposure when compared to other RF coils which use galvanic cables for power and/or RF communication. Additionally, ergonomics and aesthetics are enhanced as the use of bulky galvanic cables coupled to the RF portion may be avoided. Moreover, signal losses associated with long runs of the galvanic cables may be prevented which may result in improved image quality. Further, as only a single fiber optic cable may be coupled to the RF portion, aesthetics and handling of the RF portion may be improved.

Accordingly, embodiments of the present system may provide a receive-only RF coil portion which may harvest energy from one or more RF receive coils and store this energy in a power storage device such as a battery, a capacitor (e.g., a super-capacitor, etc.), and/or the like. The harvested energy may then be used as to run DC control circuits, amplifiers, and/or local receivers of the RF coil located in a body of the receive-only RF coil portion. Accordingly, by using an on-board power supply, embodiments of the present system may eliminate the need for galvanic conductors and their associated components such as baluns, etc. Further, by storing harvested energy which would otherwise be dissipated in a detune circuit as waste heat, localized heating may be reduced. Moreover, as localized heating may be reduced, minimum loop-trap detune resistance of embodiments of the present system may be less than the minimum loop-trap detune resistance of other detune circuits.

Figure 7:
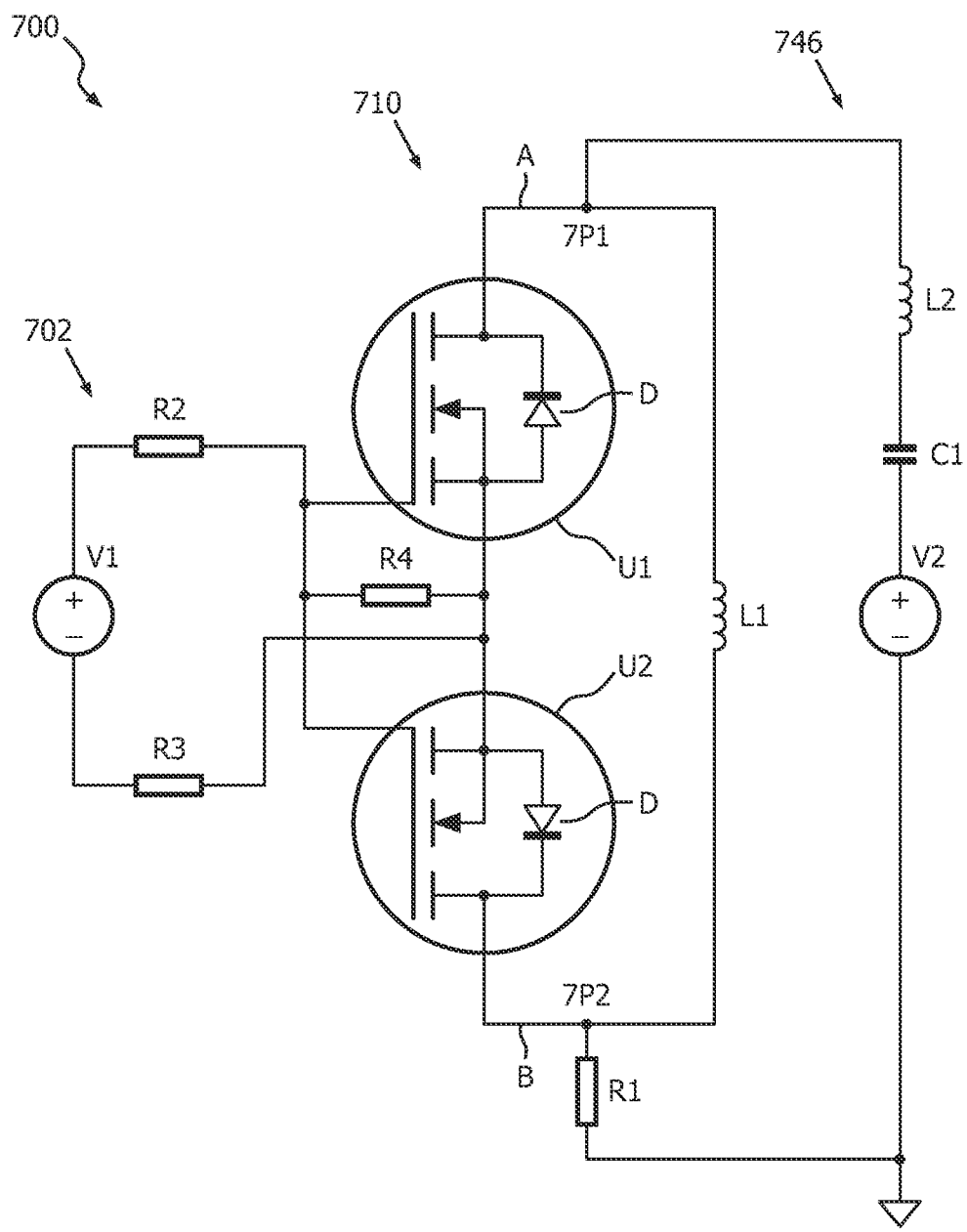
FIG. 7 shows a schematic view of a portion of field-effect transistor (FET) test circuit in accordance with embodiments of the present system.

FIG. 7 shows a schematic view of a portion of FET test circuit 700 in accordance with embodiments of the present system. The FET test circuit 700 may include a switching control circuit 702, a low-loss switch circuit 710, and a receive loop 746. The switching control circuit may be operative to control the gates of low-loss switches U1 and U2 each of which may include an anti-parallel diode (D) such that when in a detune state, low-loss switches U1 and U2 and corresponding anti-parallel diodes D may controllably insert high impedance into the receive loop 746 which is placed across terminals 7P1 and 7P2. As shown, power supply V1 provides switching control (e.g., 5 volt switching control) for the low-loss switches U1 and U2. V2 represents the voltage induced in the coil by the MR transmitter and is the source that produces a current in loop 746. The circuit shown in FIG. 7 illustrates a principle of the present system using a FET switch with a control voltage V1. To simplify the discussion and figure, this circuit does not show any charging capability and demonstrates the function as a blocking impedance. L1 is chosen to resonate with the residual capacitance of the FET switch to maximize the blocking at higher levels of V2. R2, R3 and R4 are provided to allow control of the two gate voltages with source V1.

Figure 8:
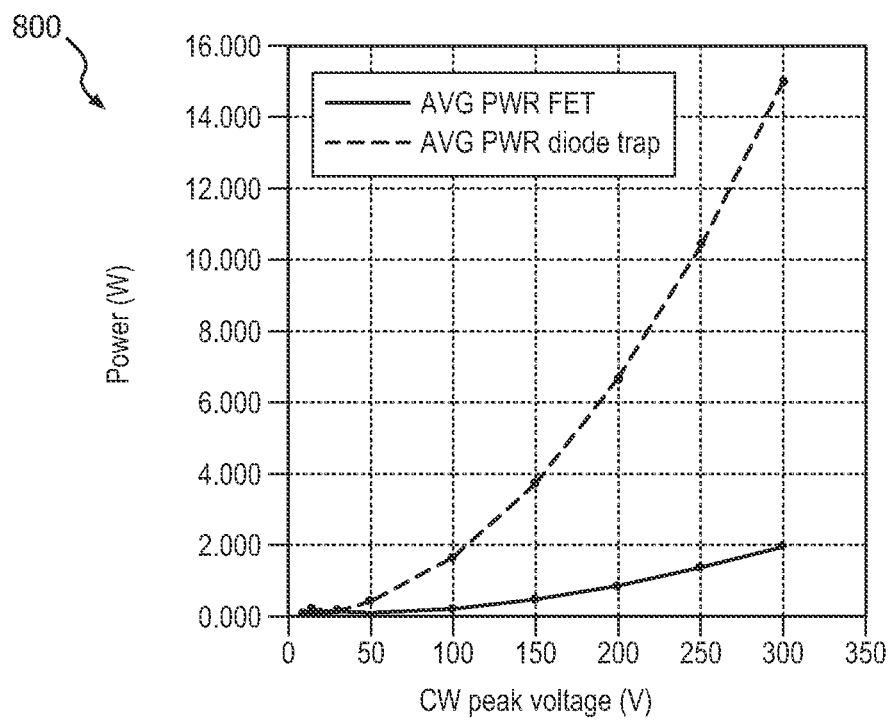
FIG. 8 shows a graph of power vs Continuous Wave (CW) peak voltage obtained in accordance with embodiments of the present system.
Figure 9:
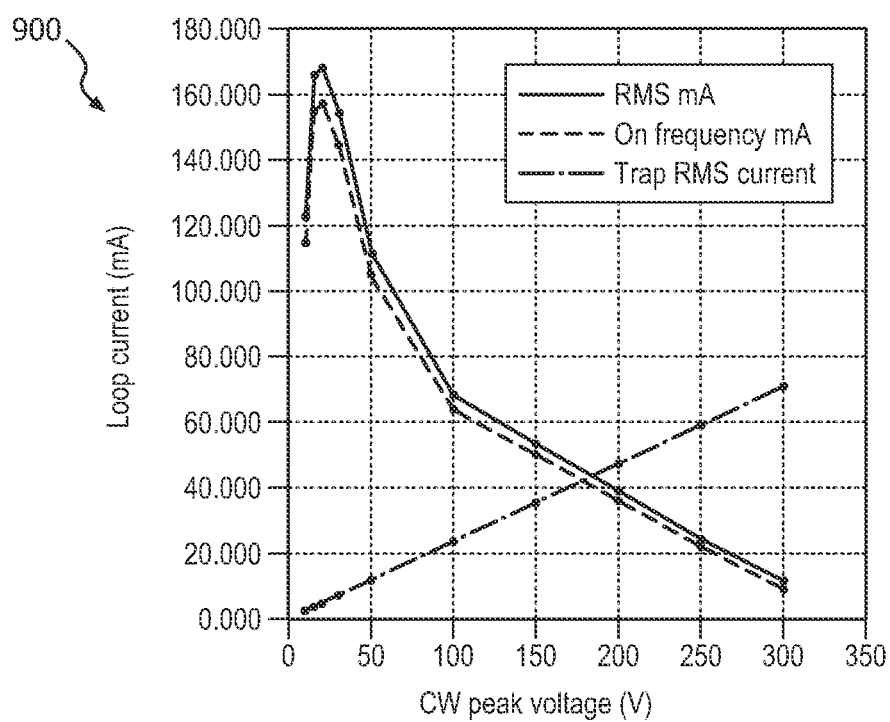
FIG. 9 shows a graph of loop current vs CW peak voltage obtained in accordance with embodiments of the present system.

Tests results obtained from tests of the FET test circuit 700 in accordance with embodiments of the present system are shown in FIGS. 8 and 9. More particularly, FIG. 8 shows a graph 800 of power vs Continuous Wave (CW) peak voltage obtained in accordance with embodiments of the present system; and FIG. 9 shows a graph 900 of loop current as a function of CW peak voltage obtained in accordance with embodiments of the present system. The graph in FIG. 8 demonstrates the power dissipated in the FET switch system vs the RF source voltage V2 vs the power dissipated in a state of the diode switch from the same source voltage. As is clear from the figure, the FET switch dissipates less power and as such, will heat much less than the diode switch. In addition, the difference between these power levels is potentially available to extract as useful energy via energy harvesting in accordance with embodiments of the present system. FIG. 9 shows the current in the loop as a function of voltage V2. Because the FET switch capacitance varies with RF voltage, the blocking is most efficient at high voltages (because inductor L1 has been chosen to resonate with the capacitance of the FET switch at the highest voltage allowable and thus the impedance is maximized at that tuning point). At lower voltages where the capacitance is higher, the blocking impedance is lower and more loop current is allowed. It should be noted that the impedance is mostly reactive below the resonant voltage level (where the switch has minimum capacitance). FIG. 9 shows this residual current increasing at lower voltages and two plots show that the nonlinear behavior creates some current at harmonics of the source voltage, but most of the current is the same frequency as the source voltage. It should be noted that lower capacitances of the switch are advantageous because the blocking is higher and the limiting current at low voltages is lower.

While the present invention has been shown and described with reference to particular exemplary embodiments, it will be understood by those skilled in the art that present invention is not limited thereto, but that various changes in form and details, including the combination of various features and embodiments, may be made therein without departing from the spirit and scope of the invention.

Further variations of the present system would readily occur to a person of ordinary skill in the art and are encompassed by the following claims.

Finally, the above-discussion is intended to be merely illustrative of the present system and should not be construed as limiting the appended claims to any particular embodiment or group of embodiments. Thus, while the present system has been described with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) any of the disclosed elements may be comprised of hardware portions (e.g., including discrete and integrated electronic circuitry), software portions (e.g., computer programming), and any combination thereof;

f) hardware portions may be comprised of one or both of analog and digital portions;

g) any of the disclosed devices or portions thereof may be combined together or separated into further portions unless specifically stated otherwise;

h) no specific sequence of acts or steps is intended to be required unless specifically indicated; and i) the term "plurality of" an element includes two or more of the claimed element, and does not imply any particular range of number of elements; that is, a plurality of elements may be as few as two elements, and may include an immeasurable number of elements.

The invention claimed is:

1. A radio-frequency (RF) coil assembly for acquiring magnetic resonance (MR) signals, comprising:
    at least one radio-frequency (RF) receive coil for acquiring the MR signals;
    a detune circuit comprising one or more circuit arms serially coupled to the at least one RF receive coil, each of one or more circuit arms having at least two low-loss switches serially coupled to each other, each of the at least two low-loss switches of each circuit arm is configured to control impedance of a corresponding receive coil to tune or detune each corresponding receive coil during tune or detune states, respectively;
    an energy storage device configured to store power;
    a power control switch coupled to each of the one or more circuit arms at a location that is between the at least two serially-coupled low-loss switches of each of the one of more circuit arms and coupled to the energy storage device; and
    a controller configured (i) to control the detune circuit to detune the RF receive coil to enter a detune state and (ii) to control the power control switch when the RF receive coil is in the detuned state to connect the RF receive coil to the energy storage device to draw power from the RF receive coil during the detuned state.

2. The apparatus of claim 1, wherein the energy storage device includes a battery.

3. The apparatus of claim 1, wherein the at least one power control switch is selectively controlled to control an impedance of the detune circuit.

4. The apparatus of claim 1, wherein the controller controls each of the at least two low-loss switches of each of the one or more circuit arms to be substantially non-conductive when it is determined to enter the detune state.

5. The apparatus of claim 1, wherein the controller controls each of the at least two low-loss switches of each of the one or more circuit arms to be substantially conductive when it is determined not to enter the detune state.

6. The apparatus of claim 1, wherein the one or more circuit arms are coupled in parallel to each other to form a full-bridge circuit.

7. The apparatus of claim 1, wherein the detune circuit is configured to tune the at least one RF receive coil to a resonance frequency when in a tune state and to detune the at least one RF receive coil when in the detune state.

8. A radio-frequency (RF) coil assembly for acquiring magnetic resonance (MR) signals, comprising:
    at least one radio-frequency (RF) receive coil for acquiring the MR signals;
    a detune circuit comprising two circuit arms serially coupled to the at least one RF receive coil and coupled in parallel to each other, each of the two circuit arms having at least two low-loss switches serially coupled to each other, each of the at least two low-loss switches of each circuit arm is configured to control impedance of a corresponding receive coil to tune or detune each corresponding receive coil during tune or detune states, respectively; and
    a charge control circuit comprising an energy storage device configured to store power, at least one power control switch coupled between one of the two circuit arms and the energy storage device to control a drawing of power from the RF receive coil to energy storage device in the detune state, the charge control circuit coupled to each of two circuit arms at a location that is between the at least two serially-coupled low-loss switches of each of the two circuit arms and configured to in the detuned state draw power from the at least one RF receive coil and store the drawn power in the energy storage device.

9. The apparatus of claim 8, further comprising a controller configured to control a duty cycle of the at least one power control switch during the detuned state to control the impedance of the detune circuit in the detune state.

10. The apparatus of claim 8, the RF coil assembly further comprising a housing configured to contain the at least one RF receive coil, the detune circuit and the charge control circuit.

11. The apparatus of claim 8, further comprising a controller configured to control each of the at least two low-loss switches of each of the two circuit arms to be substantially conductive during a tune state and substantially non-conductive during a detune state.

12. The apparatus of claim 11, wherein the controller is further configured to selectively control the draw of power from the RF receive coil in the detuned state by controlling a duty cycle of the at least one power control switch.

13. The apparatus of claim 8, wherein the detune circuit is configured to tune the at least one RF receive coil to a resonance frequency when in a tune state and to detune the at least one RF receive coil when in a detune state.

14. A magnetic resonance (MR) system, comprising:
   at least one main magnet for generating a main magnetic field comprising a substantially homogenous magnetic field within a scanning volume;
   a radio frequency (RF) portion comprising RF transmit coils configured to output RF pulses, and an RF reception portion configured to acquire MR signals from the scanning volume during a tune state and to digitize the acquired MR signals within a housing of the RF reception portion, the RF reception portion comprising:
      at least one radio-frequency (RF) receive coil for acquiring the MR signals,
      a detune circuit coupled to the at least one RF receive coil and configured to detune the at least one RF receive coil during a detune state, the detune circuit comprising: one or more circuit arms serially coupled to the at least one RF receive coil, each of one or more circuit arms having at least two low-loss switches serially coupled to each other, each of the at least two low-loss switches of each circuit arm is configured to control impedance of the at least one RF receive coil to tune or detune each corresponding receive coil during tune or detune states, respectively,
      an energy storage portion configured to store energy from the at least one RF receive coil when the RF reception portion is in the detune state, and
      a power control switch configured to decouple the energy storage portion from the at least one RF receive coil when the RF reception portion is in the tune state and couple the energy storage portion to the at least one RF receive coil while the RF receive coil is in the detuned state.

15. The apparatus of claim 14, wherein the RF reception portion comprises a plurality of channels, one or more of the channels comprising at least one of:
   the at least one radio-frequency (RF) receive coil;
   the detune circuit; and
   the energy storage portion.

16. The apparatus of claim 14, wherein the power control switch has a controlled duty cycle to control an amount of energy drawn off the RF receive coil by the energy storage portion when in the detune state.

* * * * *